United States Patent
Nam et al.

(10) Patent No.: US 9,908,285 B2
(45) Date of Patent: Mar. 6, 2018

(54) THREE-DIMENSIONAL TEXTURING OF TWO-DIMENSIONAL MATERIALS

(71) Applicant: The Board of Trustees of the University of Illinois, Urbana, IL (US)

(72) Inventors: SungWoo Nam, Savoy, IL (US); Cai Mike Wang, Scarborough (CA)

(73) Assignee: THE BOARD OF TRUSTEES OF THE UNIVERSITY OF ILLINOIS, Urbana, IL (US)

(*) Notice: Subject to any disclaimer, the term of this patent is extended or adjusted under 35 U.S.C. 154(b) by 25 days.

(21) Appl. No.: 14/716,303

(22) Filed: May 19, 2015

(65) Prior Publication Data
US 2015/0340436 A1   Nov. 26, 2015

Related U.S. Application Data (60) Provisional application No. 62/107,864, filed on Jan. 26, 2015, provisional application No. 62/001,099, filed on May 21, 2014.

(51) Int. Cl.
*B29C 61/02* (2006.01)
*H01L 29/06* (2006.01)
(Continued)

(52) U.S. Cl.
CPC .............. *B29C 61/02* (2013.01); *B29C 65/66* (2013.01); *B29C 66/73715* (2013.01); *C01B 31/0484* (2013.01); *H01L 21/3247* (2013.01); *H01L 21/477* (2013.01); *H01L 29/0657* (2013.01); *H01L 29/1606* (2013.01); *H01L 29/66742* (2013.01); *H01L 29/778* (2013.01); *H01L 29/7842* (2013.01); *H01L 29/78681* (2013.01);
(Continued)

(58) Field of Classification Search
CPC .... B29C 61/02; B29C 65/66; B29C 65/73715
See application file for complete search history.

(56) References Cited

U.S. PATENT DOCUMENTS 8,828,302 B2 * 9/2014 Khine .................. B29C 59/14
                                                    264/342 R
2011/0135884 A1 * 6/2011 Lettow .................. B32B 1/04
                                                    428/174
(Continued)

FOREIGN PATENT DOCUMENTS

AU          1066483 A  *  7/1983  ............. B29C 51/14

OTHER PUBLICATIONS

Zang et al. Multifunctionality and control of the crumpling and unfolding of large-area graphene. Nature Materials, vol. 12, 2013, 321-325.*
(Continued)

*Primary Examiner* — Atul P. Khare
(74) *Attorney, Agent, or Firm* — Brinks Gilson & Lione (57) ABSTRACT

A method of creating crumples in a monolayer entails contacting a monolayer comprising a two-dimensional material with a thermally contractible polymer, and heating the thermally contractible polymer to contract the polymer and induce buckling of the monolayer, where a plurality of crumples are formed in the monolayer due to the buckling. A device having a crumpled microstructure includes a monolayer comprising a two-dimensional material and including a plurality of crumples.

13 Claims, 7 Drawing Sheets

(51) Int. Cl.

| | | |
|---|---|---|
| H01L 29/16 | (2006.01) | |
| H01L 29/786 | (2006.01) | |
| H01L 29/66 | (2006.01) | |
| H01L 21/324 | (2006.01) | |
| H01L 21/477 | (2006.01) | |
| B29C 65/66 | (2006.01) | |
| B29C 65/00 | (2006.01) | |
| H01L 29/78 | (2006.01) | |
| H01L 29/778 | (2006.01) | |
| C01B 31/04 | (2006.01) | |

(52) U.S. Cl.
CPC .. *H01L 29/78684* (2013.01); *H01L 29/78696* (2013.01)

(56) References Cited

U.S. PATENT DOCUMENTS

| | | | | |
|---|---|---|---|---|
| 2012/0200008 | A1* | 8/2012 | Khine | B29C 59/14 264/448 |
| 2012/0202702 | A1* | 8/2012 | Khine | G01N 1/40 506/9 |
| 2013/0309450 | A1* | 11/2013 | Khine | B08B 17/065 428/141 |
| 2014/0318591 | A1* | 10/2014 | Shelby | B29C 61/02 136/225 |

OTHER PUBLICATIONS

Bowden et al. Spontaneous formation of ordered structures in thin films of metals supported on an elastomeric polymer. Nature, vol. 393, 1998, 146-149.*
Bae, Sukang et al., "Roll-to-roll production of 30-inch graphene films for transparent electrodes," *Nature Nanotechnology*, 5 (Aug. 2010), pp. 574-578, www.nature.com/naturenanotechnology.
Bang, Jaehoon et al., "Assembly and Densification of Nanowire Arrays via Shrinkage," *Nano Letters*, 14 (2014), pp. 3304-3308.
Bao, Wenzhong et al., "Controlled ripple texturing of suspended graphene and ultrathin graphite membranes," *Nature Nanotechnology*, 4 (Sep. 2009), pp. 562-566.
Bissett, Mark A. et al., "Enhanced Chemical Reactivity of Graphene Induced by Mechanical Strain," *ACS Nano*, 7, 11 (2013), pp. 10335-10343; www.acsnano.org.
Bissett, Mark A et al., "Mechanical Strain of Chemically Functionalized Chemical Vapor Deposition Grown Graphene," *The Journal of Physical Chemistry C*, 117 (2013), pp. 3152-3159.
Bolotin, K.I. et al., "Ultrahigh electron mobility in suspended graphene," *Solid State Communications*, 146 (2008), pp. 351-355.
Castellanos-Gomez, Andres et al., "Local Strain Engineering in Atomically Thin $MoS_2$," *Nano Letters*, 13 (2013), pp. 5361-5366.
Chen, X. et al., "Herringbone Buckling Patterns of Compressed Thin Films on Compliant Substrates," *Journal of Applied Mechanics*, 71 (Sep. 2004), pp. 597-603.
Choi, Jonghyun et al., "Graphene Bioelectronics," *Biomed Eng. Lett.*, 3 (2013), 201-208.
Cohen-Karni, Tzahi et al., "Graphene and Nanowire Transistors for Cellular Interfaces and Electrical Recording," *Nano Letters*, 10 (2010), pp. 1098-1102.
Cranford, Steven W. et al., "Packing efficiency and accessible surface area of crumpled graphene," *Physical Review B*, 84 (2011) pp. 205451-1-205451-7.
Fasolino, A. et al., "Intrinsic ripples in graphene," *Nature Materials*, 6 (Nov. 2007), pp. 858-861.
Felton, S. et al., "A method for building self-folding machines," *Science*, 345, 6197 (Aug. 8, 2014), pp. 644-646.
Felton, Samuel M. et al., "Self-folding with shape memory composites," *Soft Matter*, 9, 32 (Aug. 28, 2013), pp. 7688-7694.
Frackowiak, Elzbieta et al., "Carbon materials for the electrochemical storage of energy in capacitors," *Carbon*, 39 (2001) pp. 937-950.

Fu, Chi-Cheng et al., "Tunable Nanowrinkles on Shape Memory Polymer Sheets," *Advanced Material*, 21 (2009), pp. 4472-4476.
Geim, A. K. et al., "Van der Waals heterostructures," *Nature*, 499 (Jul. 25, 2013), pp. 419-425.
Grimes, Anthony et al., "Shrinky-Dink microfluidics: rapid generation of deep and rounded patterns," *Lab Chip*, 8 (2008), pp. 170-172.
Guinea, F. et al., "Energy gaps and a zero-field quantum Hall effect in graphene by strain engineering," *Nature Physics*, 6 (Jan. 2010), pp. 30-33.
Guinea, F. et al., "Generating quantizing pseudomagnetic fields by bending graphene ribbons," *Physical Review B*, 81 (2010) 035408-1-035408-5.
Guinea, F. et al., "Midgap states and charge inhomogeneities in corrugated graphene," *Physical Review B*, 77 (2008), pp. 075422-1-075422-8.
Jiang, Tao et al., "Interfacial Sliding and Buckling of Monolayer Graphene on a Stretchable Substrate," *Advanced Functional Materials*, 24 (2014), pp. 396-402.
Jiang, Hanqing et al., "Mechanics of precisely controlled thin film buckling on elastomeric substrate," *Applied Physics Letters*, 90 (2007), pp. 133119-1-133119-3.
Khang, Dahl-Young et al., "A Stretchable Form of Single-Crystal Silicon for High-Performance Electronics on Rubber Substrates," *Science*, 311 (Jan. 13, 2006), pp. 208-212.
Kim, Beom Joon et al., "High-Performance Flexible Graphene Field Effect Transistors with Ion Gel Gate Dielectrics," *Nano Letters*, 10 (2010), pp. 3464-3466.
Lee, Changgu et al., "Measurement of the Elastic Properties and Intrinsic Strength of Monolayer Graphene," *Science*, 321 (Jul. 18, 2008), pp. 385-388.
Levy, N. et al., "Strain-Induced Pseudo-Magnetic Fields Greater Than 300 Tesla in Graphene Nanobubbles," *Science*, 329 (Jul. 30, 2010), pp. 544-547.
Liu, Ying et al., "Self-folding of polymer sheets using local light absorption," *Soft Matter*, 8, 6 (Feb. 14, 2012), pp. 1703-2044.
Luo, Jiayan et al., "Compression and Aggregation-Resistant Particles of Crumpled Soft Sheets," *ACS Nano*, 5, 11 (2011), pp. 8943-8949.
Martins, Luiz G. P. et al., "Direct transfer of graphene onto flexible substrates," *PNAS*, 110, 44 (Oct. 29, 2013), pp. 17762-17767.
Mohiuddin, T. M. G. et al., "Uniaxial strain in graphene by Raman spectroscopy: G peak splitting, Grüneisen parameters, and sample orientation," *Physical Review B*, 79 (2009), pp. 205433-1-205433-8.
Nam, SungWoo et al., "All-Carbon Graphene Bioelectronics," *35th Annual International Conference of the IEEE EMBS*, Osaka, Japan, Jul. 3-7, 2013, pp. 5654-5657.
Novoselov, K. S. et al., "A roadmap for graphene," *Nature*, 490 (Oct. 11, 2012), pp. 192-200.
Novoselov, K. S. et al., "Electric Field Effect in Atomically Thin Carbon Films," *Science*, 306 (Oct. 22, 2004), pp. 666-669.
Novoselov, K. S. et al., "Two-dimensional atomic crystals," *PNAS*, 102, 30 (Jul. 26, 2005), pp. 10451-10453.
Pan, Zhonghuai et al., "Wrinkle Engineering: A New Approach to Massive Graphene Nanoribbon Arrays," *Journal of the American Chemical Society*, 133 (2011), pp. 17578-17581.
Park, Jang-Ung et al., "Synthesis of monolithic graphene-graphite integrated electronics," *Nature Materials*, 11 (Feb. 2012), pp. 120-125.
Pereira, Vitor M. et al., "Strain Engineering of Graphene's Electronic Structure," *Physical Review Letters*, 103 (2009), pp. 046801-1-046801-4.
Reina, Alfonso et al., "Large Area, Few-Layer Graphene Films on Arbitrary Substrates by Chemical Vapor Deposition," *Nano Letters*, 9, 1 (2009), pp. 30-35.
Reserbat-Plantey, Antoine et al., "Strain Superlattices and Macroscale Suspension of Graphene Induced by Corrugated Substrates," *Nano Letters*, 14 (2014), pp. 5044-5051.
Ruoff, Rodney, "A means to an end," *Nature*, 483 (Mar. 15, 2012); p. 2.
Schedin, F. et al., "Detection of individual gas molecules adsorbed on graphene," *Nature Materials*, 6 (Sep. 2007), pp. 652-655.

(56) References Cited

OTHER PUBLICATIONS

Seol, Jae Hun et al., "Two-Dimensional Phonon Transport in Supported Graphene," *Science*, 328 (2010), pp. 213-216.
Shioya, Hiroki et al., "Straining Graphene Using Thin Film Shrinkage Methods," *Nano Letters*, 14 (2014), pp. 1158-1163.
Srivastava, Deepak et al., "Predictions of Enhanced Chemical Reactivity at Regions of Local Conformational Strain on Carbon Nanotubes: Kinky Chemistry," *J. Phys. Chem. B*, 103, 21 (1999), pp. 4330-4337.
Whitby, Raymond L. D., "Chemical Control of Graphene Architecture: Tailoring Shape and Properties," *ACS Nano*, 8, 10 (2014), pp. 9733-9754.
Zang, Jianfeng et al., "Localized ridge wrinkling of stiff films on compliant substrates," *Journal of the Mechanics and Physics of Solids*, 60 (2012) pp. 1265-1279.
Zhang, Sanliang et al., "Supercapacitor performance of crumpled and planar graphene materials produced by hydrogen gas reduction of graphene oxide," *Journal of Materials Chemistry A*, 1 (2013), pp. 7957-7962.
Zhang, Yuanbo et al., "Experimental observation of the quantum Hall effect and Berry's phase in graphene," *Nature*, 438 (Nov. 10, 2005), pp. 201-204.
Zhu, Wenjuan et al., "Structure and Electronic Transport in Graphene Wrinkles," *Nano Letters*, 12 (2012), pp. 3431-3436.

\* cited by examiner

THREE-DIMENSIONAL TEXTURING OF TWO-DIMENSIONAL MATERIALS

RELATED APPLICATIONS

The present patent document claims the benefit of priority under 35 U.S.C. § 119(e) to U.S. Provisional Patent Application No. 62/001,099, filed on May 21, 2014, and to U.S. Provisional Patent Application No. 62/107,864, filed on Jan. 26, 2015, both of which are hereby incorporated by reference in their entirety.

FEDERALLY SPONSORED RESEARCH OR DEVELOPMENT

This invention was made with government support under contract number FA-2386-13-1-4125 awarded by the U.S. Air Force. The government has certain rights in the invention.

TECHNICAL FIELD

The present disclosure is related generally to processing two-dimensional materials and more particularly to producing two-dimensional materials having corrugated structures.

BACKGROUND

Graphene, a single atomic layer of $sp^2$-bonded carbon atoms, has been a material of intensive research and interest over recent years. The combination of its exceptional mechanical properties, high carrier mobility, thermal conductivity, and chemical inertness make it a candidate material for next generation optoelectronic, electromechanical and bio-electronic applications. Particularly, graphene's large surface-to-volume ratio, low detection limit, and high sensitivity have enabled graphene-based field-effect transistor (FET) sensors with a single molecule detection limit. Significant progress has been made in realizing large-area graphene synthesis, transferability onto various substrates, and device integration with other low-dimensional and conventional materials. Recent efforts have focused on controlling the physical properties of graphene by altering its morphology. For example, electrical properties can be modulated via elastic strain engineering whereby localized bending of graphene alters the electronic band structures and can induce pseudo-magnetism. In addition to the aforementioned phenomena, mechanical straining of graphene can be exploited to intentionally induce three-dimensionality (3D) to this otherwise 2D material, with the goal of developing textured graphene as a candidate material platform for 3D electrodes and sensors. The increased surface area of textured graphene may enhance the degree of functionalization of the material and alter its chemical reactivity, which may be advantageous for applications such as electrode materials in electrochemical cells and supercapacitors.

BRIEF SUMMARY

A simple method to achieve 3D texturing or crumpling of two-dimensional materials has been developed and is described herein. Also disclosed are compositions and devices comprising crumpled microstructures.

A method of creating crumples in a monolayer entails contacting a monolayer comprising a two-dimensional material with a thermally contractible polymer, and heating the thermally contractible polymer to contract the polymer and induce buckling of the monolayer. A plurality of crumples are formed in the monolayer due to the buckling.

A device having a crumpled microstructure includes a monolayer comprising a two-dimensional material and including a plurality of crumples.

DETAILED DESCRIPTION

Described herein is a novel method for controlled buckling or crumpling of two-dimensional (2D) materials (such as graphene) via heat-induced contractile deformation of an underlying substrate. The intent of the work is to create significant three-dimensional (3D) features (e.g., buckles, crumples, wrinkles or corrugations) in two-dimensional materials in a deterministic and scalable fashion. The present method exploits the thermally-induced transformation of shape memory thermoplastics and is simple, scalable and spatially selective.

Figure 1A:
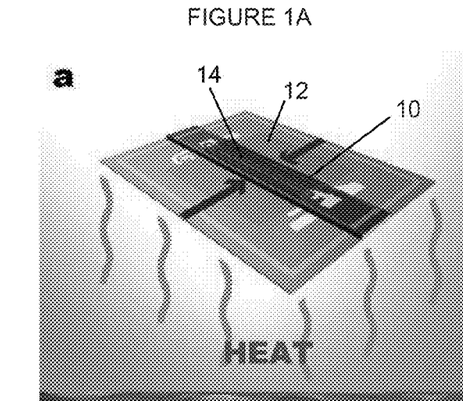
FIG. 1A shows heating of a thermally contractible polymer to contract the polymer and induce buckling of a monolayer comprising graphene.
Figure 1B:
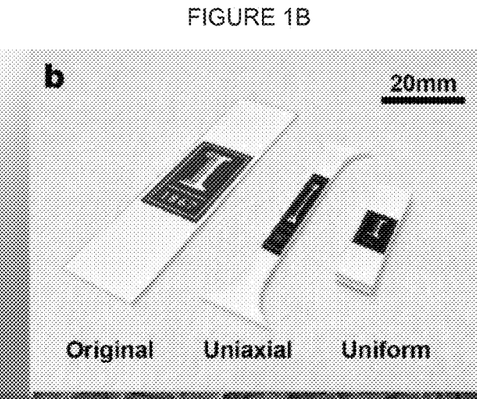
FIG. 1B illustrates subjecting an untreated sample (original, left) to different texturing schemes of uniaxial strain (middle) and uniform or equi-biaxial strain (right).
Figure 1C:
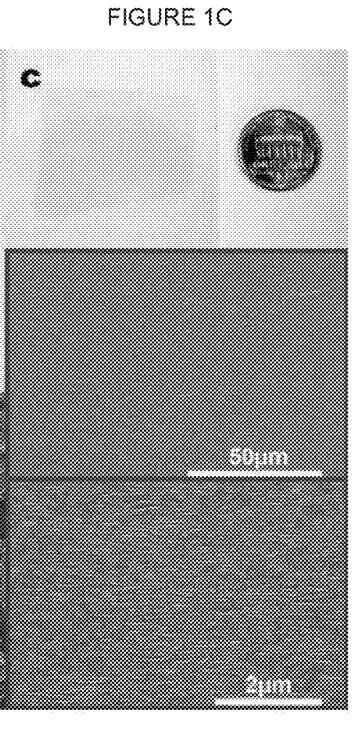
FIG. 1C provides a photograph (top) and scanning electron micrograph (SEM) images (middle and bottom) that show the uniformity of a graphene film transferred onto polystyrene using a solution transfer technique.
Figure 1D:
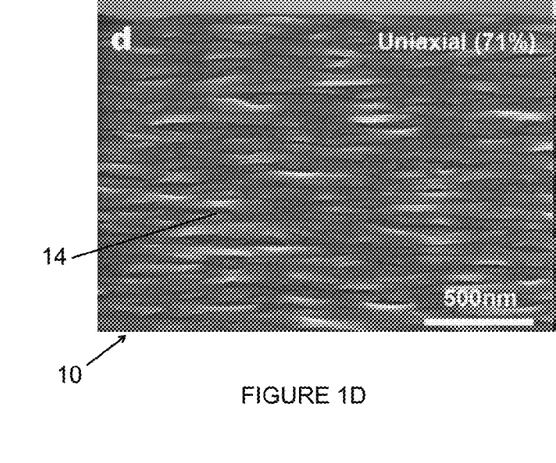
FIGS. 1D and 1E show high-magnification SEM images that reveal exemplary graphene crumple morphologies due to uniaxial (71%) and equi-biaxial/uniform (58%) strains, respectively.

FIG. 1A provides a schematic illustration of the new method of forming crumples in a monolayer comprising a two-dimensional material. Referring to FIG. 1A, the method entails contacting the monolayer 10 with a thermally contractible polymer 12, and then heating to shrink or contract the polymer 12. Contraction of the polymer 12 (as illustrated by the arrows) induces buckling of the monolayer 10, and the buckling creates a plurality of crumples 14 in the monolayer 10, as shown for example in FIGS. 1D-1E, 7A-7B and 8A-8B. Prior to heating, the monolayer 10 comprising the two-dimensional material may be substantially smooth on a micro- or nanoscale. The monolayer 10 may also have a planar or gradually curving morphology prior to buckling.

The two-dimensional material that makes up all or a portion of the monolayer may be graphene, boron nitride, silicene, germanane, and/or a chalcogenide represented by $MX_2$, where M=transition metal atom and X=chalcogen atom. An exemplary chalcogenide is $MoS_2$. As used in the present disclosure, a "a two-dimensional material" includes an atomic or molecular species that repeats in two dimensions. For example, the two-dimensional material graphene comprises a single layer of $sp^2$-bonded carbon atoms. "Crumples" may be understood to be wrinkles or corrugations in the monolayer or stack of monolayers, as shown in various micrographs included in the figures. Also, as would be understood by one of ordinary skill in the art, a monolayer or two-dimensional material described as "crumpled" includes a plurality of crumples.

The heating to contract the polymer and induce buckling of the monolayer may be carried out at a temperature $T_g \pm 0.2 T_g$, where $T_g$ is a glass transition temperature of the thermally contractible polymer, which may be a thermoplastic polymer, such as polystyrene, polyolefin, polyvinyl chloride, polyethylene, polyethylene terephthalate, or polypropylene. In one example, the heating may occur at a temperature in the range of from about $T_g-10°$ C. to about $T_g+20°$ C. The heating may be carried out for a time duration of from about 30 seconds to 24 hours, from about 5 minutes to 2 hours, or from about 30 minutes to about 1.5 hours. When localized heating of the polymer is employed, as described below, the time durations may generally be shorter (e.g., from about 10 seconds to 10 minutes, or from about 10 seconds to 1 minute).

During heating, the thermally contractible polymer may contract an amount $L-L_0$ corresponding to a compressive strain of from about 1% to about 1000%. Typically, the amount of compressive strain is about 100% or less. For example, the compressive strain may be in the range of from about 1% to about 80%, e.g., from about 30% to about 75%. In the present disclosure, the term "compressive strain" may be alternately referred to as "macroscopic compressive strain," "macroscopic strain," or simply "strain."

Prior to carrying out the method, the monolayer may be formed on a substrate by vapor deposition, and the substrate may then be removed by etching. For example, graphene and also graphite samples may be synthesized using established chemical vapor deposition (CVD) techniques on metal films (e.g., copper foils and/or cobalt-copper (Co—Cu) thin films). Copper has negligible carbon solubility and thus may yield from 1-3 monolayers of graphene on the surface, whereas Co—Cu thin films with a higher carbon solubility can be used to synthesize graphite films of a desired thickness, as described further below. To minimize contamination and ensure material compatibility with the target polymeric substrate, a solution-based transfer approach may be employed where the monolayer is transferred to the thermally contractible polymer in solution and without the use of a carrier film, such as a poly(methyl methacrylate) (PMMA) or metallic film that may require subsequent chemical treatment.

During the heating, the thermally contractible polymer may be constrained at two opposing ends to induce uniaxial contraction, or the thermally contractible polymer may be unconstrained so as to allow free contraction in all direction. Alternatively, the thermally contractible polymer may be constrained at only one end, or at three ends, or in another geometry.

In general, three texturing schemes may be realized: (1) uniaxial, (2) equi-biaxial or uniform, and (3) localized. In the uniaxial texturing case, boundary conditions are applied whereby two ends of the thermally contractible polymer are held stationary to restrict contraction in the longitudinal direction, such that only the lateral width decreases. In the case of uniform contraction, the constraint may be removed and the thermally contractible polymer is allowed to freely move on a clean and rigid flat surface, such as a glass slide. In the case of localized heating of one or more portions of the thermally contractible polymer, crumples may be formed in one or more localized regions of the monolayer that are in contact with the one or more portions of the polymer, while other regions of the monolayer may remain uncrumpled (e.g., flat or gently curved). The size of the localized portion(s) of the polymer that undergo heating may be determined by the spot size of the heat source, and may have dimensions ranging from the micro- to the millimeter scale.

Accordingly, the crumples may be randomly arranged or may have a predetermined position and/or spacing in the monolayer, depending on the processing conditions (e.g., duration and temperature of heating, irradiation area, mechanical constraints on the polymer, etc.) For example, the crumples may have a pitch of about 500 nm or less, or about 100 nm or less, in at least one direction parallel to a plane of the monolayer. For example, the pitch may be from about 10 nm to about 75 nm.

Due to the presence of the crumples, the monolayer may exhibit a microscale or nanoscale surface roughness over all or a portion of the monolayer. For example, the monolayer may exhibit a root-mean-square (RMS) roughness of about 500 nm or less, about 300 nm or less, about 200 nm or less, about 100 nm or less, about 50 nm or less, about 30 nm or less, about 20 nm or less, or about 10 nm or less. Typically the RMS roughness is at least about 1 nm, at least about 2 nm, at least about 3 nm, at least about 4 nm, or at least about 5 nm. For example, the RMS roughness may range from about 1 nm to about 500 nm, from about 2 nm to about 100 nm, or from about 2.5 nm to about 10 nm.

After the heating of the thermally contractible polymer, the monolayer may be transferred from the thermally contractible polymer to another substrate, such as glass (e.g., $SiO_2$) or another material. In addition, after forming the plurality of crumples, the thermally contractible polymer may be reheated and stretched so that the monolayer can return to a planar or curved morphology without crumples.

Accordingly, a device comprising a monolayer comprising a two-dimensional material and including a plurality of crumples may be formed. The plurality of crumples may be present throughout the entirety of the monolayer, or in only one or more regions of the monolayer, such that the monolayer further includes uncrumpled regions. The two-dimensional material may be as described above, and the device may further comprise a stack of the monolayers. The monolayer(s) may be in contact with a substrate comprising a thermoplastic polymer, as described above, or the monolayer may be in contact with a non-polymeric substrate, such as $SiO_2$, due to a post-crumpling transfer process (e.g., a solution transfer process).

In one example, the device may be a field effect transistor comprising a source electrode, a drain electrode, and a channel therebetween, where the channel comprises the monolayer. Each of the source and drain electrodes may comprise a gold film that also includes a plurality of crumples. The field effect transistor may be solution-gated, as described further in the examples below. To form such a device, prior to heating the thermally contractible polymer, a gold film may be deposited onto the monolayer and a source electrode and drain electrode may be defined from the gold film, such that the monolayer connects the source electrode to the drain electrode. In this case, heating of the thermally contractible polymer may induce buckling of the monolayer and also the source and drain electrodes.

In an example carried out with a monolayer comprising graphene on a polystyrene (PS) substrate, the graphene crumpling is realized by heating the PS substrate above its glass transition temperature (about ~120° C.), thereby inducing contraction of the polymer and buckling of the monolayer in contact with the polymer. The resultant compressive strain can form a well-defined crumpled texturing of the graphene/graphite layer without any prior patterning, such as with photo- or nano-imprint-lithography.

To systematically investigate the evolution of graphene crumples as a function of macroscopic compressive strain (i.e., amount of polymer contraction), scanning electron microscope (SEM) and atomic force microscope (AFM) images were obtained and 2D fast Fourier transform (FFT) analysis was conducted. The SEM images of FIG. 2A (inset) show the development of linear crumples with concomitant observable increase in crumple alignment and coherence as the uniaxial strain increases. Occasionally, sparse cracks may develop during heat treatment, which allows visual distinction of crumple formation on an otherwise flat PS substrate, indicating that the crumples are intrinsic to the graphene and not due to corrugation of the substrate.

Figure 1E:
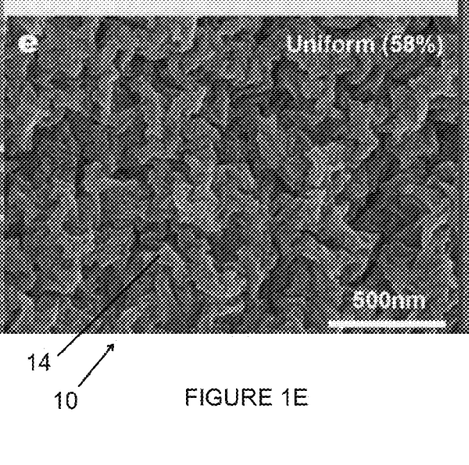
Figure 2A:
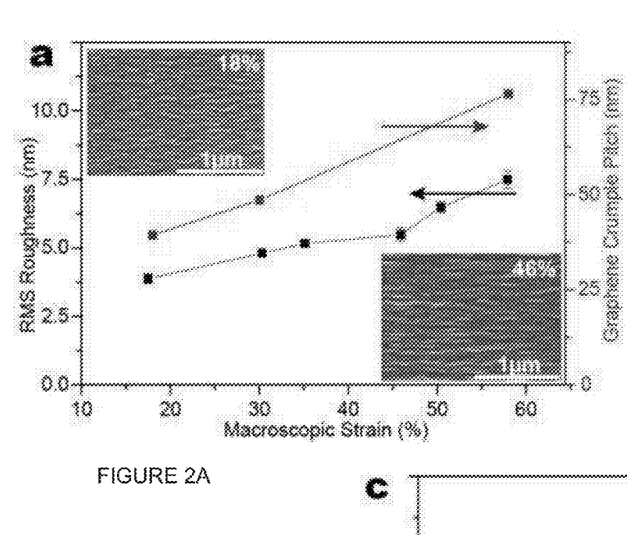
FIG. 2A reveals that both RMS roughness and crumple pitch increase monotonically with increasing uniaxial compressive strain. The inset SEM images show uniaxial crumples corresponding to a macroscopic strain of 18% and 46%, respectively. The error bars represent one standard deviation.

For the uniform or equi-biaxial case, on the other hand, patterns resembling disorganized herringbone structures may develop, as shown by the SEM images of FIG. 1E. AFM derived topography data for uniaxially crumpled graphene reveals a monotonic increase in the measured root mean square (RMS) surface roughness and crumple pitch (obtained by 2D FFT analysis) as the strain increases, as shown in FIG. 2A. The average measured RMS roughness of graphene crumples reaches up to ~8 nm with a macroscopic compressive strain of ~70%, where the percentage strain is defined as the linear percentage change in dimensions of the polymer, which is polystyrene in this case.

Figure 2B:
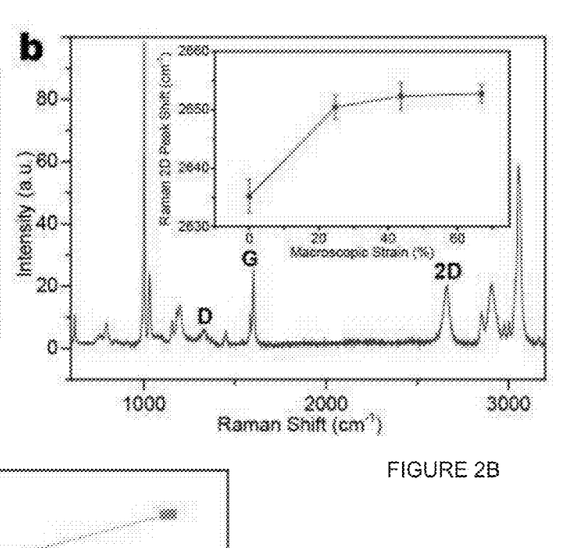
FIG. 2B shows a Raman spectrum of uniaxially strained (71%) graphene crumples. Inset shows the 2D peak position shift as a function of increasing uniaxial strain. The error bars represent one standard deviation.

Raman spectroscopy characterization confirms the presence of quality graphene as compressive strain increases, as shown in FIG. 2B. The Raman D-to-G peak intensity ratio does not change significantly as the strain increases, which demonstrates that the physical integrity of crumpled graphene is preserved and that deformation of graphene is highly elastic in both the uniaxial and equi-biaxial cases. A consistent blue shift of the 2D band is observed as the macroscopic compressive strain increases, as revealed in the inset of FIG. 2B. Due to the position of the graphene Raman G peak with respect to the background peaks of PS and the susceptibility of the G peak position to doping effects, the shift in 2D peak position is considered as an indicator of the intrinsic amount of strain developed inside the crumples. Up to a macroscopic uniaxial strain of 67%, the 2D peak position (as fitted by a single Lorentzian function) exhibits blue shifts from ~2636 $cm^{-1}$ to ~2653 $cm^{-1}$. Considering previous estimates of a −64 $cm^{-1}$/% blue shift arising from intrinsic uniaxial compressive strain, the ~17 $cm^{-1}$ blue shift measured may correspond to an intrinsic strain of ~0.27%.

To confirm that 3D features such as crumples do not adversely affect graphene's electrical properties, two-terminal electrical resistance measurements were carried out by successively increasing the uniaxial strain and measuring in a direction transverse to the crumples. No significant increase in the resistance is observed even up to the maximum attainable 73% compressive strain, with the modest increase in resistance shown in FIG. 2C (~36%) attributable to physical damage from repeated probe contact and/or environmental exposure during successive heat treatment steps used to increase the strain. From both Raman and two-terminal electrical measurements, it can be deduced that graphene's integrity can be preserved as the compressive strain is increased, and that there may be little or no plastic deformation or damage of the graphene.

Figure 2C:
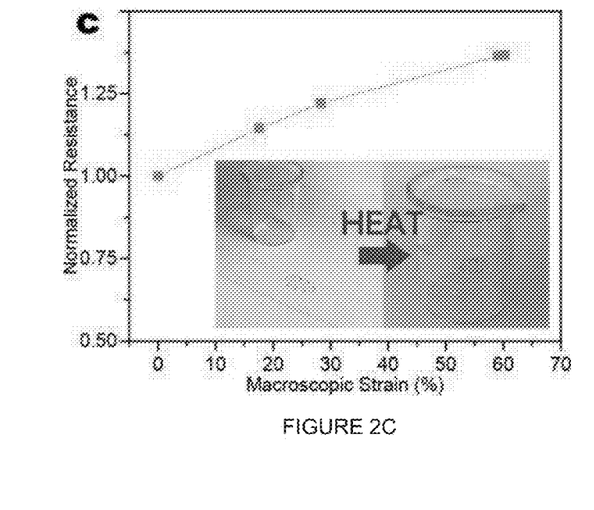
FIG. 2C shows that there is no significant increase in two-terminal resistance as uniaxial strain increases, indicating that the integrity of the graphene is preserved during crumpling. The inset photograph illustrates the capability of the monolayer to integrate onto arbitrary curvilinear and 3D surfaces, such as a beaker.

The use of a thermoplastic polymer such as PS allows for facile integration with other materials in unconventional ways; for example, the polymer may conform to and interface with arbitrary geometries. This is demonstrated by molding a PS substrate with crumpled graphene onto curved and/or 3D objects, such as a small glass beaker, as shown in the inset of FIG. 2C. Additionally, crumpled graphene formed with this approach is amenable to subsequent transfer onto arbitrary substrates, as thermally-shrinkable polymers such as PS may be easily removed in contrast to elastomers such as PDMS. This allows for the integration of the crumpled graphene onto any of a variety of substrates via a simple solvent treatment to remove the polymer, followed by a solution-based transfer process. For example, crumpled graphene may be transferred from a polymer such as PS onto a silicon oxide substrate while preserving the crumpled morphology.

Figure 3A:
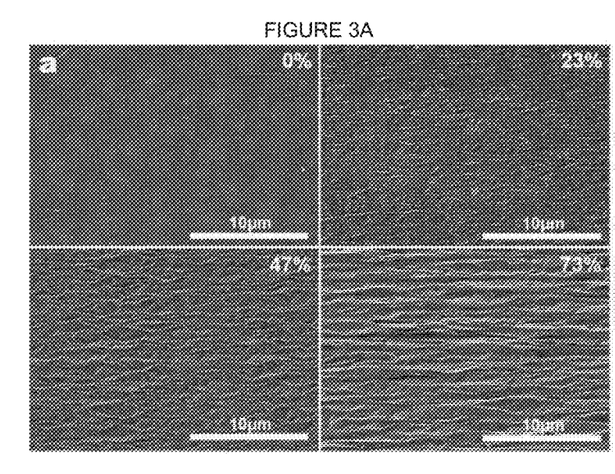
FIG. 3A shows an SEM image of flat/untextured (0% strain) and crumpled graphite formed by a uniaxial strain of 23%, 47% and 73%, respectively.
Figure 3B:
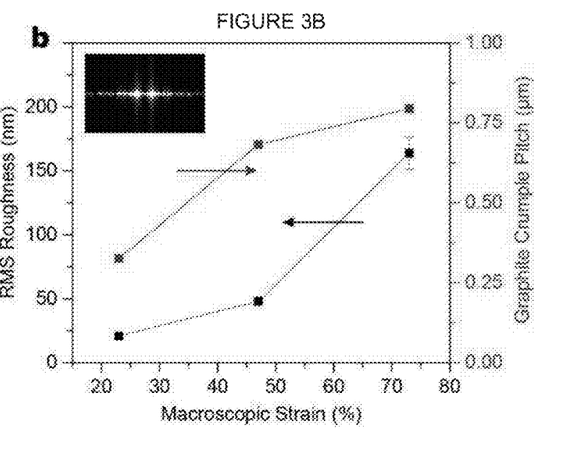
FIG. 3B shows that both the RMS roughness and crumple pitch increase monotonically with increasing uniaxial compressive strains. The error bars represent one standard deviation. The inset shows a 2D fast Fourier transform (FFT) obtained from atomic form microscopy (AFM) data of crumpled graphite formed by 73% uniaxial straining.

The thickness effect on crumpling of multilayer graphene (e.g., a stack of graphene monolayers) is explored and material characterizations are performed for similarly crumpled graphite films (average thickness of ~5 nm) synthesized using Co—Cu catalyst thin-films. SEM images shown in FIG. 3A and also AFM height renders clearly show the development of increasing height of crumples as a function of macroscopic compressive strains. Notably, bifurcation leading to hierarchical wrinkling is evident in the AFM renders, where a secondary crumple periodicity of larger wavelength and amplitude develops along with the original, finer crumple pattern. Consequently, the 2D FFT (see FIG. 3B inset) shows an increasing crumple pitch as a function of strain, as shown by the data of FIG. 3B. As with graphene, the graphite crumples also show a monotonic increase in RMS roughness with larger compressive strains.

Figure 4A:
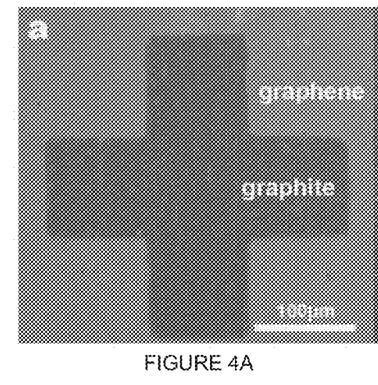
FIG. 4A shows an optical microscope image of an original graphite cross pattern monolithically connected with a graphene background on a 285 nm $SiO_2$ substrate. Graphite features are ~20 nm thick relative to the graphene background.
Figure 4B:
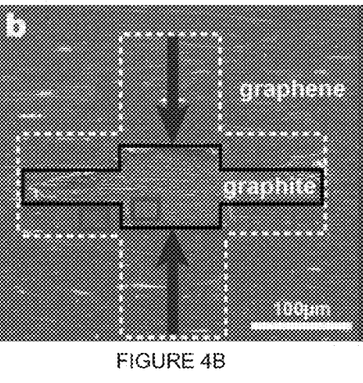
FIG. 4B shows an SEM image of heterogeneous graphene-graphite cross pattern subjected to 70% uniaxial strain (dotted white outline indicates original cross pattern dimensions prior to texturing, and solid black outline shows outline after texturing).
Figure 4C:
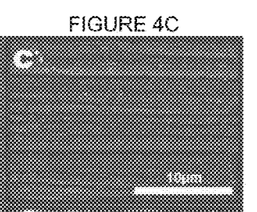
FIG. 4C shows an SEM image of the background graphene, which exhibits noticeably smaller crumples than the thicker graphite region, which is shown in the SEM image of FIG. 4D.
Figure 4D:
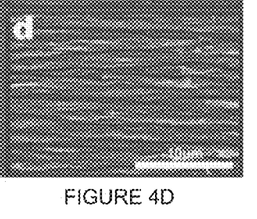

The unique aspect of thickness controlled crumpling behavior is further substantiated by investigating monolithic crumpling of connected, heterogeneous graphene-graphite patterns. A symmetrical cross pattern of thick graphite monolithically connected to a graphene background is prepared and shown in FIGS. 4A and 4B. Upon uniaxial contraction of the pattern, the originally symmetrical cross-shaped graphite feature (white dotted line in FIG. 4B) is deformed uniaxially into an asymmetric pattern reflecting the degree of contraction (~70%, as shown by black solid line in FIG. 4B). A difference in crumple topography can be observed between graphene (surrounding the cross pattern) (FIG. 4C) and graphite (inside the cross pattern) (FIG. 4D). Furthermore, the monolithic interface may be preserved between crumpled graphene and graphite.

Figure 5A:
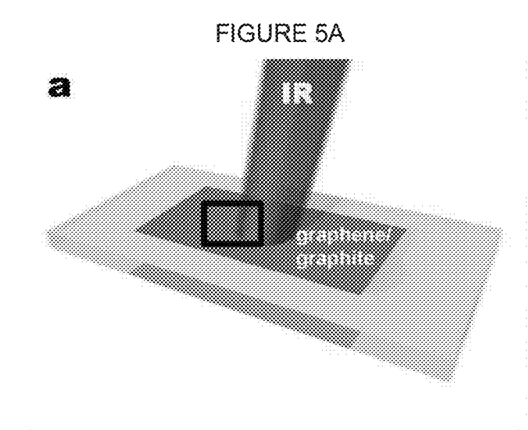
FIG. 5A is a schematic showing how localized patterning of crumples may be achieved. Selected areas of a sample including graphene and graphite on a thermally-contractible polymer are exposed to thermal irradiation to induce localized contraction of the polymer and consequent buckling of the graphene/graphite.
Figure 5B:
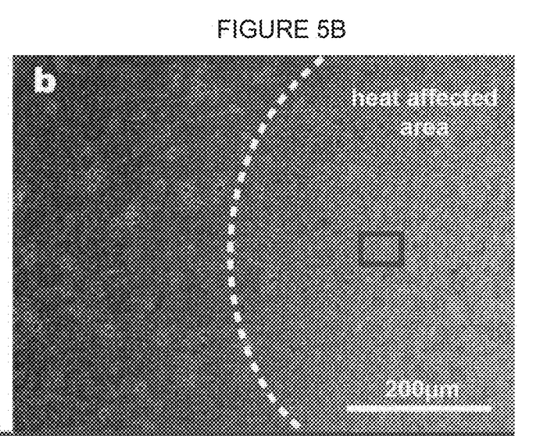
FIG. 5B is a dark field optical microscope image of the sample of FIG. 5A showing the heat affected area, which has a crumpled microstructure, as well as the unheated region which is substantially flat and has a different contrast. The interface between the two regions is shown as a dotted line.
Figure 5C:
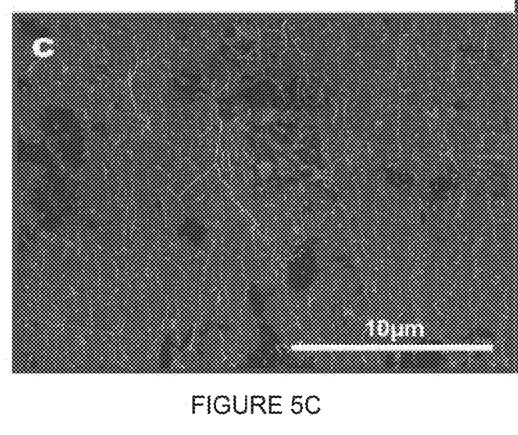
FIGS. 5C and 5D are SEM images showing the lack of and the presence of crumples, respectively, on either side of the interface.
Figure 5D:
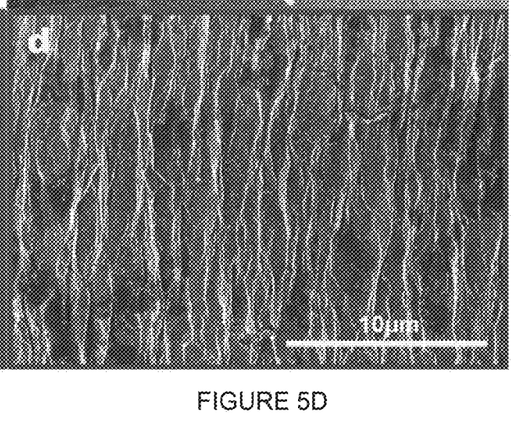

As mentioned above, localized patterning of crumples may be achieved by spatially selective heating of the substrate. In an example described here, selectively controlled local texturing of graphene/graphite on PS is achieved by the application of a concentrated infrared (IR) source on specific locations of the sample. This direct localized patterning approach can be carried out immediately after the monolayer has been transferred to the polymer substrate. At the junction of the heat-affected area with the non-heated region, the presence (or absence) of crumples is clearly visible, as shown in FIG. 5B. High magnification SEM images at both regions show the lack of and the presence of crumples in the unaffected (FIG. 5C) and affected regions (FIG. 5D), respectively. Using this simple, single-step approach, localized control over the crumpling of graphene or graphite is possible without any additional pre- or post-fabrication.

To establish that the localized patterning via IR irradiation does not adversely contribute to additional graphene defect formation, the D peak intensity is characterized before and after 20 seconds of constant IR irradiation under ambient conditions for graphene on a flat 285 nm $SiO_2$ substrate as a control without interference from any PS Raman background. The peak intensities in the spectra are almost identical, and there is no appreciable increase in the intensity or broadening of the D peak even after 20 seconds of constant IR irradiation on the control sample, which is significantly longer than the typical irradiation time used for localized texturing (~5 s). Aside from comparing the Raman spectra, four-point probe sheet resistance measurements of graphene on $SiO_2$ were conducted before and after the same 20 s IR irradiation. These measurements confirmed that the irradiation does not significantly adversely affect the conductivity of the graphene.

Figure 6A:
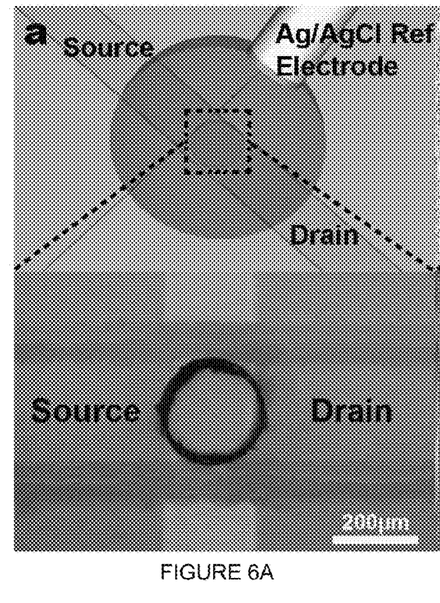
FIG. 6A shows a schematic drawing (top) and an optical microscope image (bottom) of a solution-gated FET device including crumpled gold source and drain electrodes and a polyimide polymer passivation layer with a ~230 μm crumpled graphene channel. The device is solution-gated with deionized water.
Figure 6B:
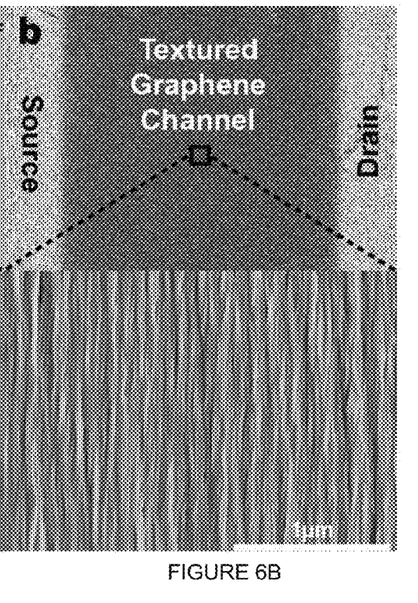
FIG. 6B shows SEM images of the FET device of FIG. 6A showing a channel comprising crumpled graphene and source and drain electrodes comprising a crumpled gold film.
Figure 6C:
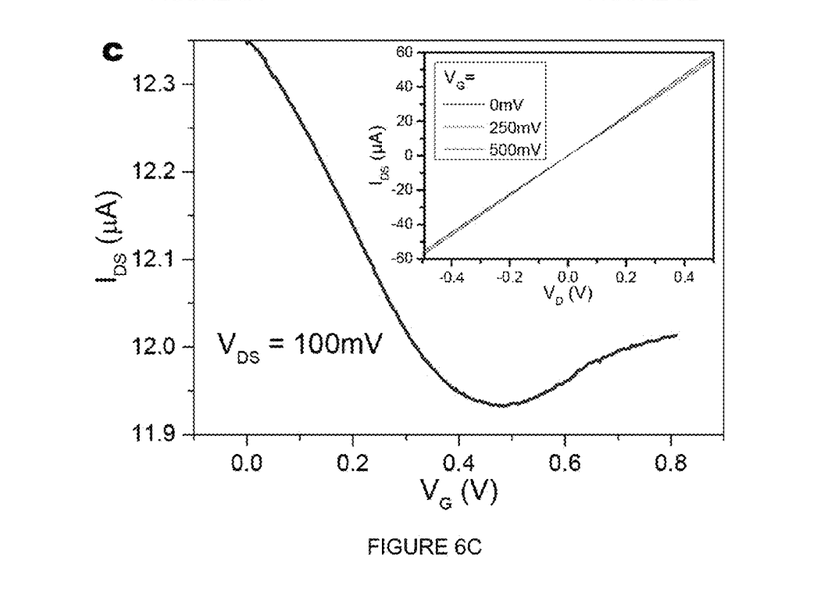
FIG. 6C shows transfer and output (inset) characteristics of a crumpled graphene FET.

Crumpled graphene FET arrays were synthesized and characterized in a solution-gated configuration, as shown in FIG. 6A. The FET device utilizes gold electrodes as the source and drain contacts and a crumpled graphene monolayer serves as the channel, as shown in FIG. 6B. The crumpled graphene monolayer is passivated with a polyimide layer as described below with only the channel exposed to deionized water for gating. At a water gate sweep between 0 V to 0.8 V using a Ag/AgCl reference electrode (FIG. 6C), ambipolar field-effect gating was observed with estimated hole and electron field-effect mobilities of 497 and 157 $cm^2/Vs$, respectively.

These results show the capability to easily create 3D crumpled structures from otherwise 2D monolayers or films using simple thermal treatment and/or IR irradiation. The crumpled morphologies are tunable, and the ability to form deterministic patterns with varying induced strain direction and amount, film thickness, and localized patterning has also been demonstrated. This thermally-activated shape-memory polymer induced crumpling of two-dimensional materials such as graphene has several key advantages over earlier work. First, the simplicity of thermal processing allows deterministic tunability of crumple morphology and density over a large range of strains via simple processing parameters (e.g., duration, temperature, irradiation area, and mechanical constraints). Furthermore, this approach allows for spatially controlled texturing via direct local patterning for the first time. Second, the method provides a simple and robust platform for studying the texturing and strain phenomena of a wide range of other novel two-dimensional materials of recent interest, such as silicene, germanane, hBN, $MoS_2$, and other dichalcogenides. The ubiquity, scalability, and low cost of polystyrene shape-memory polymers and the simplicity of thermal processing may offer a pathway that is conducive to large-scale manufacturing of textured graphene/graphite devices, circumventing costly lithographic pre-patterning and post-pressing deposition steps.

The facile, single-step, controlled texturing of graphene and graphite into 3D crumples via thermally induced contractile deformation of an oriented PS substrate has been described. The work demonstrates that 3D texturing or crumpling of two-dimensional materials can be modulated by varying simple processing parameters, and the material integrity of the two-dimensional material may be maintained even up to induced macroscopic compressive strains as large as ~70%. Furthermore, texturing of monolithic graphene-graphite patterns revealed that continuous interfaces are preserved between graphene and graphite crumples. In addition, the deterministic, spatially localized 3D patterning of graphene/graphite crumples has been demonstrated, enabling the native creation of a mixture of uncrumpled/crumpled heterogeneous morphologies based on graphene/graphite alone without any substrate pre-patterning or post-processing material deposition. Finally, a solution-gated, crumpled graphene FET device and arrays thereof have been described. It is believed that this approach can be easily extended to a variety of other 2D materials (such as $MoS_2$ and other dichalcogenides), and is much more amenable to large scale manufacturing of 3D graphene structures as compared to previously reported methods. This direct patterning approach may enable monolithic integration of flat (or curved) and textured graphene/graphite to realize mechanically robust and flexible advanced 3D biosensors in the future.

EXAMPLES

Synthesis/Transfer of Graphene, Graphite and Graphene-Graphite Heterostructure Patterns Graphene is synthesized by chemical vapor deposition (CVD) (Rocky Mountain Vacuum Tech Inc., CO) using 25 μm thick copper foil (Alfa Aesar, MA) in a methane (100 sccm) and hydrogen (50 sccm) atmosphere at 1050° C., 520 mTorr for 2 minutes. The copper foil is cleaned with acetone, isopropyl alcohol (IPA), and hydrochloric acid and then annealed at 1050° C. prior to synthesis for ~60 minutes in 150 mTorr hydrogen atmosphere.

To minimize contamination and ensure material compatibility with a polystyrene (PS) substrate, an aqueous solution transfer approach is employed to apply the centimeter-scale graphene films onto target substrates (PS or $SiO_2$) without the use of a carrier film, such as poly(methyl methacrylate) (PMMA), which is typical of conventional transfer techniques.

Following CVD synthesis, the as-grown graphene on copper foil is carefully floated onto the surface of a prepared sodium persulphate ($Na_2S_2O_8$) etchant solution (Sigma Aldrich, MA) for several hours without the use of any carrier film/medium. Complete removal of copper is verified visually and immediately after substantially complete copper dissolution has occurred, and the resulting free floating graphene film is then twice transferred to deionized (DI) water surface to remove residual etchant and finally transferred onto cleaned oriented PS sheets (K&B Innovations, WI). To minimize the breakage of the graphene film, extreme care is exercised to minimize any disturbance to the setup and liquid interface, with measures including securing the container to the lab bench and sealing the container to prevent air entrainment and turbulence. Furthermore, both the glass slides used to transfer the graphene for DI water rinsing and the PS target substrate are pre-wetted in DI water to minimize surface tension disturbances to the liquid interface when retrieving the graphene film. During the retrieval process, the target substrate is kept at a constant angle of ~45° and held very steadily while being raised out of the liquid.

Graphite and graphene-graphite heterostructure pattern samples are prepared similarly via CVD synthesis on cobalt and copper thin film catalyst substrates, which are deposited via plasma sputtering (AJA International, MA) on a 285 nm $SiO_2$ wafer. Following established CVD techniques, the as-grown surface graphite and graphene-graphite films are carefully transferred onto the same aforementioned sodium persulphate solution surface for etching of the catalyst metallic layer with the aid of a spun-on PMMA (Sigma Aldrich, MA) carrier top layer film. The graphite and graphene-graphite heterostructure patterns with the PMMA film slowly cleave away from the wafer as the metallic layers are etched. The graphite/graphene/PMMA films are subsequently twice transferred similarly to DI water for cleaning and finally onto clean PS and $SiO_2$ substrates. The PMMA carrier top layer is finally removed with glacial acetic acid (compatible with PS) and subsequent rinsing in DI water.

Uniaxial vs. Uniform/Equi-Biaxial vs. Localized Thermal Activation of PS to Produce Crumpled Graphene and/or Graphite Graphene and/or graphite on a PS substrate are thermally activated in a standard lab oven (BINDER, Germany) at 120° C. The uniaxial samples are made by securing two ends of a PS sheet with a custom-made aluminum fixture while the equi-biaxial/uniform samples are simply laid on a clean glass slide during thermal treatment. Varying amounts of induced strain are achieved by adjusting the duration of heat treatment, which varies from 35 to 90 minutes. The resultant crumpled morphology is consistent throughout substantially the entire sample, irrespective of position on the surface or proximity to edges with the bare PS substrate.

The resulting percentage strains are calculated as % strain=$(l_o-l_t)/l_o$, where $l_o$ and $l_t$ represent the linear sample dimensions before and after thermal activation, respectively. For example, a reduction in dimensions from 15 mm to 4 mm is equivalent to a strain of 73%, consistent with the linear percentage change in dimensions as defined in ASTM D1204-02.

The area percent quantity represents a normalized increase in effective topographical surface area relative to the nominal AFM scan size. For example, an area percent increase of ~50% is equivalent to a topographical area of 37.5 $\mu m^2$ on a 25 $\mu m^2$ scan domain (5×5 μm scan).

Localized patterned samples are made by concentrating a 20-watt infrared source with a spot size of about 5 mm onto the PS sheet backside of the graphene/graphite surface. The IR source (IR-Si253-P-1, Hawkeye Technologies, CT) includes a silicon nitride active element and a one inch parabolic reflector. The IR is directly illuminated onto the sample in ambient conditions with no other optics used.

Material Characterization

Optical microscope images are captured in dark field transmission and reflection modes (Axio Imager M2m, Carl Zeiss, Germany). Scanning electron microscopy (SEM) images (S-4800, Hitachi, Japan) are obtained for graphene samples after being coated with 2.5 nm of AuPd to improve imaging contrast; graphite and graphene-graphite heterostructure samples are not coated. A wide-field SEM image is compiled using Adobe Illustrator (Adobe Systems, CA) from individual standard SEM images. AFM surface data recorded in tapping mode (MFP-3D, Asylum Research, CA) using a tip with a tip radius of ≤10 nm and high aspect ratio (7:1), and subsequently second order flattened; RMS roughness and 2D fast Fourier transform are calculated using IGOR Pro (WaveMetrics, OR) and Gwyddion 2.38, respectively. Raman spectra are obtained with a 633 nm laser source (InVia microPL, Renishaw, UK) at 1800/mm grating and one second accumulation. Infrared thermal images of the IR setup are taken with a thermal camera (T400, FLIR, OR). Sheet resistance measurements are conducted using a linear four-point probe head (RM3-AR, Jandel Engineering, UK) on the lowest probe pressure dial setting in order to minimize contact and puncture damage to the sample. Field-effect transistor and two terminal resistance measurements are performed with a probe station (PM8, SUSS Micro Tec, Germany) and a digital sourcemeter (2614B, Keithley Instruments, OH).

Fabrication/Characterization of Crumpled Graphene Field Effect Transistor (FET)

Crumpled graphene FET devices are made by evaporating 50 nm thick gold electrodes through a shadow mask onto graphene transferred onto PS. After electrode deposition, the source and drain contacts are then defined by mechanically scratching the sample surface with a micromanipulator controlled tip, followed by thermally-induced texturing which yields the crumpled graphene channel along with crumpled gold source and drain electrodes. Finally, the entire device is passivated with a polyimide layer which has a single 230 μm pore that allows for solution-gating of the crumpled graphene channel region. FET I-V characteristics are measured with a digital sourcemeter (2614B, Keithley Instruments, OH) with an Ag/AgCl reference electrode (Harvard Instruments, MA) to gate the device through freshly generated deionized water. All measurements are performed in ambient conditions.

In calculating the field-effect mobilities, the transconductance is obtained by taking the linear slope (IDS/VG) of the I-VG curve. The electric double layer capacitance (CDL) and the quantum capacitance (CQ ~28 μF/cm$^2$) are calculated for the estimation of total capacitance. To account for the effect of crumpled graphene roughness on the electric double layer capacitance, a shape factor of 1.15 is estimated based on COMSOL simulations. The effective crumpled graphene gate length (L) and width (W) from the physical device geometry are used for the field-effect mobility estimation.

Figure 7A:
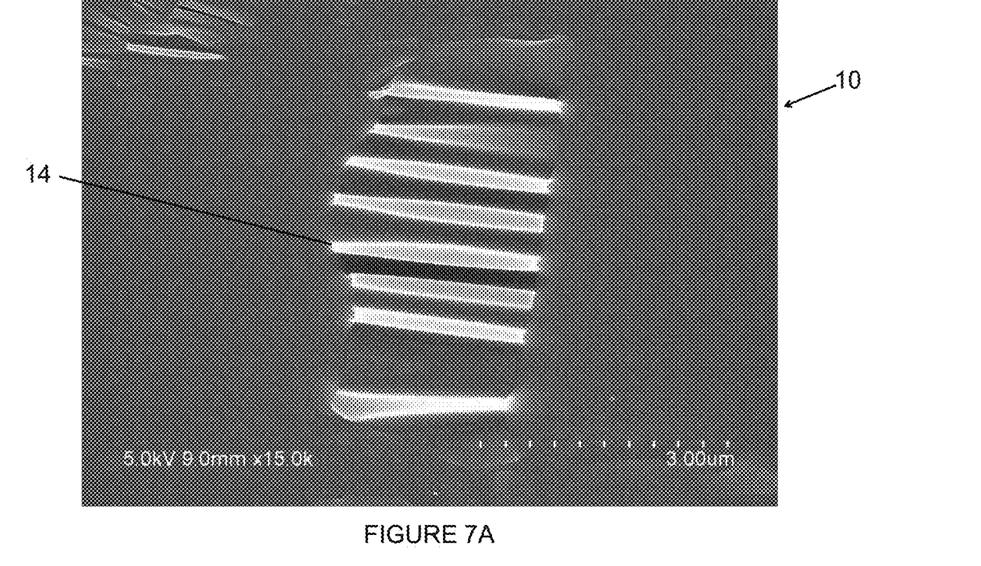
FIGS. 7A and 7B show SEM images of crumpled $MoS_2$ produced by uniaxial straining.
Figure 7B:
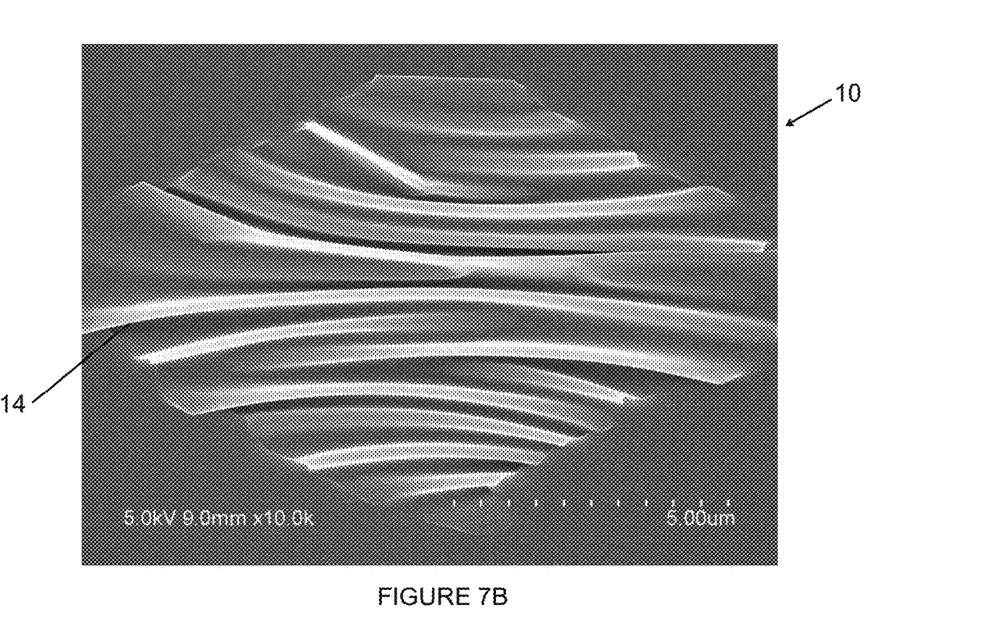
Figure 8A:
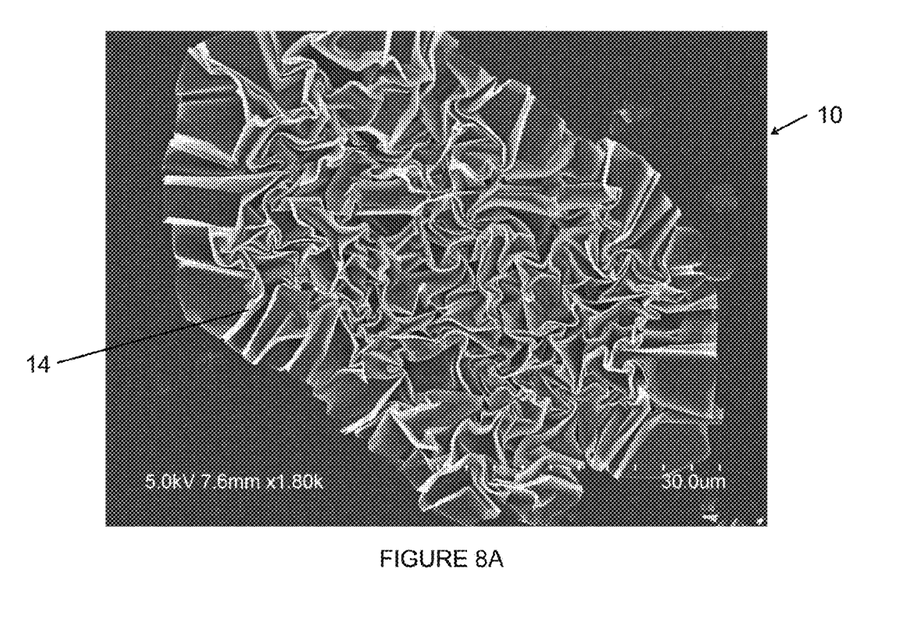
FIGS. 8A and 8B show SEM images of crumpled $MoS_2$ produced by uniform/equi-biaxial straining.
Figure 8B:
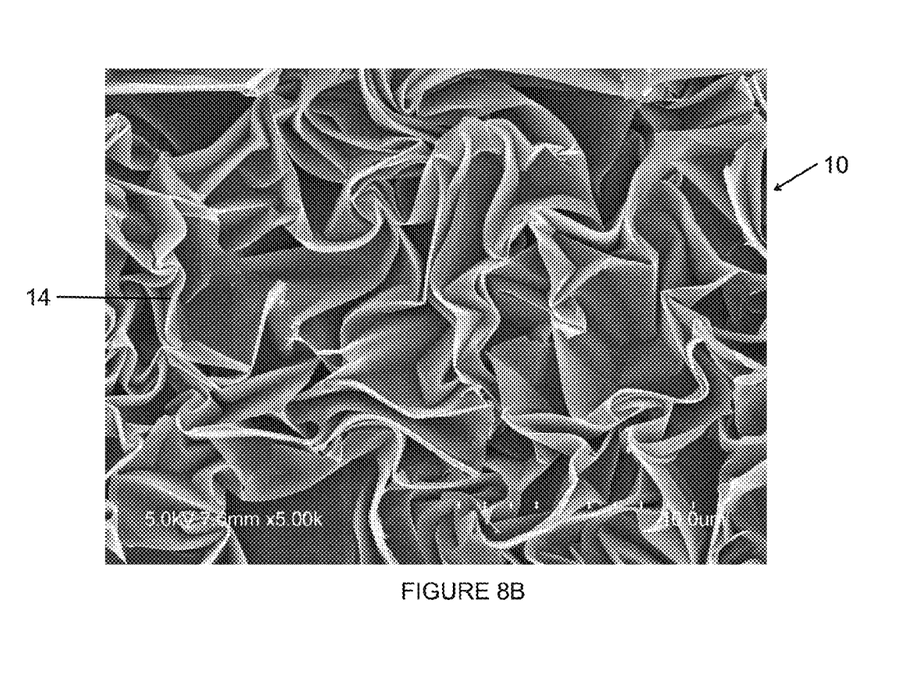

Uniaxial vs. Uniform/Equi-Biaxial Thermal Activation of PS to Produce Crumpled MoS$_2$ A monolayer of MoS$_2$ on a PS substrate is thermally activated in a standard lab oven (BINDER, Germany) at 120° C. Uniaxial samples are made by securing two ends of a PS sheet with a custom-made aluminum fixture while the equi-biaxial/uniform samples are simply laid on a clean glass slide during thermal treatment. Varying amounts of induced strain are achieved by adjusting the duration of heat treatment, which varies from 35 to 90 minutes. FIGS. 7A and 7B shows the crumpled microstructure of MoS$_2$ resulting from uniaxial straining, and FIGS. 8A and 8B show the crumpled microstructure of MoS$_2$ resulting from uniform/equi-biaxial straining.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method comprising:
 contacting a monolayer comprising a two-dimensional material with a thermally contractible polymer;
 heating the thermally contractible polymer to contract the polymer and induce buckling of the monolayer contacted therewith, a plurality of crumples being formed in the monolayer due to the buckling, the monolayer thereby comprising a crumpled morphology; and
 after the heating of the thermally contractible polymer, transferring the monolayer from the thermally contractible polymer to another substrate while preserving the crumpled morphology, the other substrate thereby including the monolayer comprising the crumpled morphology.

2. The method of claim 1, wherein the heating occurs at a temperature in the range of from about $T_g \pm 0.2 T_g$, where $T_g$ is a glass transition temperature of the thermally contractible polymer, and wherein the heating is carried out for a time duration of from about 20 seconds to 24 hours.

3. The method of claim 1, wherein the heating of the thermally contractible polymer comprises localized heating of one or more portions of the polymer, the localized heating inducing the buckling at one or more regions of the monolayer in contact with the one or more portions, and
 wherein the plurality of crumples are formed only in the one or more regions of the monolayer, other regions of the monolayer remaining uncrumpled.

4. The method of claim 3, wherein the localized heating is carried out using an infrared radiation source.

5. The method of claim 1, wherein the contracting of the thermally contractible polymer is in an amount $L-L_0$ corresponding to a compressive strain of from about 1% to about 1000%, wherein $L_0$ and L are linear dimensions of the thermally contractible polymer before and after the heating, respectively.

6. The method of claim 5, wherein the compressive strain is from about 1% to about 80%.

7. The method of claim 1, wherein contacting the monolayer with the thermally contractible polymer comprises transferring, in a solution, the monolayer to the thermally contractible polymer.

8. The method of claim 1, wherein, prior to contacting the monolayer with the thermally contractible polymer, the monolayer is formed on a substrate by vapor deposition, and the substrate is then removed by etching.

9. The method of claim 1, wherein during the heating, the thermally contractible polymer is constrained at two opposing ends to induce uniaxial contraction.

10. The method of claim 1, wherein the two-dimensional material is selected from the group consisting of: graphene, boron nitride, silicene, germanane, and a chalcogenide represented by MX$_2$, where M is a transition metal atom and X is a chalcogen atom, and
 wherein the thermally contractible polymer comprises a thermoplastic polymer.

11. The method of claim 1, whereby the monolayer is provided as a stack of monolayers, the method comprising:
 contacting the stack of the monolayers with the thermally contractible polymer;
 heating the thermally contractible polymer to contract the polymer and induce buckling of the stack contacted therewith, the plurality of crumples being formed in the stack due to the buckling, the stack thereby comprising the crumpled morphology; and
 after the heating of the thermally contractible polymer, transferring the stack from the thermally contractible polymer to the other substrate while preserving the crumpled morphology, the other substrate thereby including the stack comprising the crumpled morphology.

12. The method of claim 1, wherein the transferring further comprises removing the thermally contractible polymer using a solvent treatment.

13. The method of claim 1, wherein transferring the monolayer comprises a solution-based transfer process.

* * * * *